(12) United States Patent
Lin et al.

(10) Patent No.: US 12,396,311 B1
(45) Date of Patent: Aug. 19, 2025

(54) CAPACITIVE TOUCH LED DISPLAY

(71) Applicant: Y.LIN ELECTRONICS CO., LTD., Guangdong (CN)

(72) Inventors: Qicheng Lin, Guangdong (CN); Guoliang Qiu, Miaoli County (TW); Zhichao Ye, Guangdong (CN); Hongrui Wu, Guangxi (CN)

(73) Assignee: Y.LIN ELECTRONICS CO., LTD., Dongguan (CN)

( * ) Notice: Subject to any disclaimer, the term of this patent is extended or adjusted under 35 U.S.C. 154(b) by 0 days.

(21) Appl. No.: 18/986,698

(22) Filed: Dec. 18, 2024

(30) Foreign Application Priority Data

Nov. 27, 2024 (CN) .......................... 202422906735.2

(51) Int. Cl.
*H10H 29/855* (2025.01)
*G06F 3/041* (2006.01)
(Continued)

(52) U.S. Cl.
CPC ....... H10H 29/8552 (2025.01); G06F 3/0412 (2013.01); G06F 3/0416 (2013.01);
(Continued)

(58) Field of Classification Search
CPC ...... H10H 29/24; H10K 59/40; G06F 3/0412; G06F 3/044–0448; F24C 7/086
(Continued)

(56) References Cited

U.S. PATENT DOCUMENTS

| | | | | |
|---|---|---|---|---|
| 12,204,707 B1 * | 1/2025 | Lin | ...................... | F21V 23/0471 |
| 2005/0133347 A1 * | 6/2005 | Hein | ..................... | H03K 17/962 |
| | | | | 200/5 R |

(Continued)

FOREIGN PATENT DOCUMENTS

| | | | | | |
|---|---|---|---|---|---|
| CN | 102155692 | A * | 8/2011 | ................ | F21S 8/00 |
| CN | 201992510 | U * | 9/2011 | ................ | F21S 8/00 |

(Continued)

OTHER PUBLICATIONS

Machine translation, Xu, Chinese Pat. Pub. No. CN-206312106-U, translation date: Apr. 21, 2025, Clarivate Analytics, all pages. (Year: 2025).*

(Continued)

*Primary Examiner* — Victoria K. Hall

(57) ABSTRACT

Disclosed is a capacitive touch LED display, including an LED light-emitting assembly and a film assembly, the film assembly is fixed on a light-emitting surface of the LED light-emitting assembly, and includes a dark film, a transparent film, a white film and an insulating film; the dark film is attached onto a front side of the transparent film, a back side of the transparent film is printed with a first pattern and a first light-blocking layer, the first light-blocking layer avoids the first pattern, the transparent film is attached onto a front side of the white film, a back side of the white film is printed with a capacitive touch circuit, and the insulating film is attached onto the back side of the white film; and the white film is provided with a terminal that is electrically connected to the LED light-emitting assembly and the capacitive touch circuit.

7 Claims, 7 Drawing Sheets

(51) Int. Cl.
*G06F 3/044* (2006.01)
*H10H 29/24* (2025.01)
*F24C 7/08* (2006.01)

(52) U.S. Cl.
CPC ............. *G06F 3/044* (2013.01); *H10H 29/24* (2025.01); *F24C 7/086* (2013.01)

(58) Field of Classification Search
USPC .......................................................... 257/91
See application file for complete search history.

(56) References Cited

U.S. PATENT DOCUMENTS

| | | | | |
|---|---|---|---|---|
| 2005/0134116 A1* | 6/2005 | Hein | ...................... | H01H 13/84 307/10.1 |
| 2005/0134559 A1* | 6/2005 | Hein | ..................... | H03K 17/962 345/156 |
| 2007/0062739 A1* | 3/2007 | Philipp | .................. | G06F 3/0443 178/18.06 |
| 2011/0005818 A1* | 1/2011 | Lee | ........................ | G06F 3/0445 216/13 |
| 2012/0103778 A1* | 5/2012 | Obata | ................... | G06F 3/0443 200/600 |
| 2013/0248344 A1* | 9/2013 | Stilwell | ................ | H03K 17/962 200/600 |
| 2019/0086760 A1* | 3/2019 | Wang | ................... | H10D 86/411 |

FOREIGN PATENT DOCUMENTS

| | | | | | | |
|---|---|---|---|---|---|---|
| CN | 202808680 | U | * | 3/2013 | ................ | C09J 7/02 |
| CN | 202808681 | U | * | 3/2013 | ................ | C09J 7/02 |
| CN | 202808683 | U | * | 3/2013 | ................ | C09J 7/02 |
| CN | 202808684 | U | * | 3/2013 | ................ | C09J 7/02 |
| CN | 206312106 | U | * | 7/2017 | ............. | G06F 3/041 |
| CN | 109916063 | A | * | 6/2019 | ............. | F24F 11/52 |
| CN | 210399396 | U | * | 4/2020 | ............. | B32B 27/08 |
| CN | 212623468 | U | * | 2/2021 | ............... | G02B 1/10 |
| CN | 113777823 | A | * | 12/2021 | ....... | G02F 1/133514 |
| WO | WO-2014009154 | A1 | * | 1/2014 | ........... | G06F 3/0202 |

OTHER PUBLICATIONS

Machine translation, Liu, Chinese Pat. Pub. No. CN-102155692-A, translation date: Apr. 21, 2025, Clarivate Analytics, all pages. (Year: 2025).*

Machine translation, Lin, Chinese Pat. Pub. No. CN-113777823-A, translation date: Apr. 21, 2025, Clarivate Analytics, all pages. (Year: 2025).*

Machine translation, Liu, Chinese Pat. Pub. No. CN-201992510-U, translation date: Apr. 21, 2025, Clarivate Analytics, all pages. (Year: 2025).*

Machine translation, Deng, Chinese Pat. Pub. No. CN-212623468-U, translation date: Apr. 21, 2025, Clarivate Analytics, all pages. (Year: 2025).*

Machine translation, Jin, Chinese Pat. Pub. No. CN-202808681-U, translation date: Apr. 21, 2025, Clarivate Analytics, all pages. (Year: 2025).*

Machine translation, Qin, Chinese Pat. Pub. No. CN-210399396-U, translation date: Apr. 21, 2025, Clarivate Analytics, all pages. (Year: 2025).*

Machine translation, Jin, Chinese Pat. Pub. No. CN-202808680-U, translation date: Apr. 21, 2025, Clarivate Analytics, all pages. (Year: 2025).*

Machine translation, Jin, Chinese Pat. Pub. No. CN-202808684-U, translation date: Apr. 21, 2025, Clarivate Analytics, all pages. (Year: 2025).*

Machine translation, Jin, Chinese Pat. Pub. No. CN-202808683-U, translation date: Apr. 21, 2025, Clarivate Analytics, all pages. (Year: 2025).*

Machine translation, Cai, Chinese Pat. Pub. No. CN-109916063-A, translation date: Apr. 21, 2025, Clarivate Analytics, all pages. (Year: 2025).*

* cited by examiner

CAPACITIVE TOUCH LED DISPLAY

CROSS REFERENCE TO RELATED APPLICATIONS

The present application claims the benefit of Chinese Patent Application No. 202422906735.2 filed on Nov. 27, 2024, the contents of which are incorporated herein by reference in their entirety.

TECHNICAL FIELD

The present disclosure relates to the technical field of LED display, and particularly relates to a capacitive touch LED display.

BACKGROUND

For existing large and small home appliances, smart home devices, industrial control equipment, and 3C electronics, such as rice cookers, soup cookers, range hoods, disinfection cabinets, dishwashers, and microwave ovens, displays/LED light groups and buttons or touch screens are arranged provided to implement the corresponding human-machine interaction control functions.

A traditional display interaction system consists of an LED light group, a backlight panel, a pattern film and a button module. When the system is in use, all patterns are illuminated by the backlight panel and LED lights, and functional indicators are always on or flash by switching different LED lights, and the button module can be upgraded as a capacitive touch module.

However, when an existing pattern lighting LED display is in an "OFF" state, patterns and digital light tubes, and the like thereof are directly displayed, a user can clearly observe colors and outlines of the patterns and digital light tubes, that is, a front panel observed by the user is not a pure color but fragmented when the display is in the "OFF" state.

In order to solve the problem, some manufacturers adopt a high-resolution capacitive touch screen and a dark-colored front panel to achieve a pure color display when the display is in the "OFF" state. However, the high-resolution capacitive touch screen is more expensive and complex to control compared with the LED light group and the pattern film. As a result, the high-resolution capacitive touch screen is generally used in high-end home appliances.

Therefore, there is an urgent need for a capacitive touch LED display that can solve one or more of the problems above.

SUMMARY

In order to solve one or more of the problems in the prior art, the present disclosure provides a capacitive touch LED display. In order to solve the above technical problem, the present disclosure provides the following technical solution: a capacitive touch LED display, and the display includes an LED light-emitting assembly and a film assembly, where the film assembly is fixed on a light-emitting surface of the LED light-emitting assembly, and the LED light-emitting assembly is configured to illuminate the film assembly and perform control functions;

the film assembly includes a dark film, a transparent film, a white film and an insulating film, where the dark film is attached onto a front side of the transparent film, a back side of the transparent film is printed with a first pattern and a first light-blocking layer, the first light-blocking layer avoids the first pattern, the transparent film is attached onto a front side of the white film. A back side of the white film is printed with a capacitive touch circuit, and a touch area of the capacitive touch circuit is printed with conductive ink, the insulating film is attached onto the back side of the white film, the insulating film is opposite to the light-emitting surface of the LED light-emitting assembly; and the white film is provided with a terminal, the capacitive touch circuit is electrically connected to the terminal, and the terminal is electrically connected to the LED light-emitting assembly.

In some embodiments, a front and/or a back side of the dark film can be formed with a frosted texture.

In some embodiments, the front side of the white film is printed with a second light-blocking layer, and the second light-blocking layer avoids the first pattern.

Further, the front side of the white film is printed with a second pattern, and the second light-blocking layer avoids the second pattern.

In some embodiments, the conductive ink is transparent conductive ink, and the insulating film is a transparent insulating film.

In some embodiments, the display further includes cushioning foam, the cushioning foam is arranged between the insulating film and the light-emitting surface of the LED light-emitting assembly, and the cushioning foam is provided with an avoidance groove capable of avoiding the patterns.

In some embodiments, the LED light-emitting assembly includes a housing and a printed circuit board (PCB), where the PCB is mounted inside the housing, and the PCB is provided with an LED circuit, an LED driving circuit, a main control circuit, a capacitive sensing control circuit and a capacitive touch control circuit; and the capacitive touch circuit is electrically connected to the capacitive sensing control circuit and the capacitive touch control circuit; and the housing is provided with a light-transmitting groove, and a spatial position of the light-transmitting groove corresponds to an LED bead of the LED circuit; and further, the housing is connected to a corresponding bottom shell.

Further, the LED light-emitting assembly adopts a front lighting structure or a side lighting structure. When the LED light-emitting assembly adopts the side lighting structure, the housing is provided with a corresponding light guide plate.

Further, a light-emitting angle of the LED bead is between 120°-160°.

The present disclosure has the following technical effects: lighting display of the patterns is implemented through the above film assembly and LED light-emitting assembly. Specifically, the film assembly ensures that the front panel, that is, an outer side of the dark film, is in a pure dark color state when the LED light is turned off, in which case, it is difficult for the user to observe outlines and colors of the patterns, as well as the non-dark film through the display, such that the display surface observed by the user is integrated despite that the display is in the OFF state. Moreover, when the display is in the normal working state, the LED light can illuminate the patterns through the film assembly, thereby displaying the corresponding outlines and colors of the patterns, and the user can also perform touch control according to the corresponding light-emitting pattern.

Figure 1:
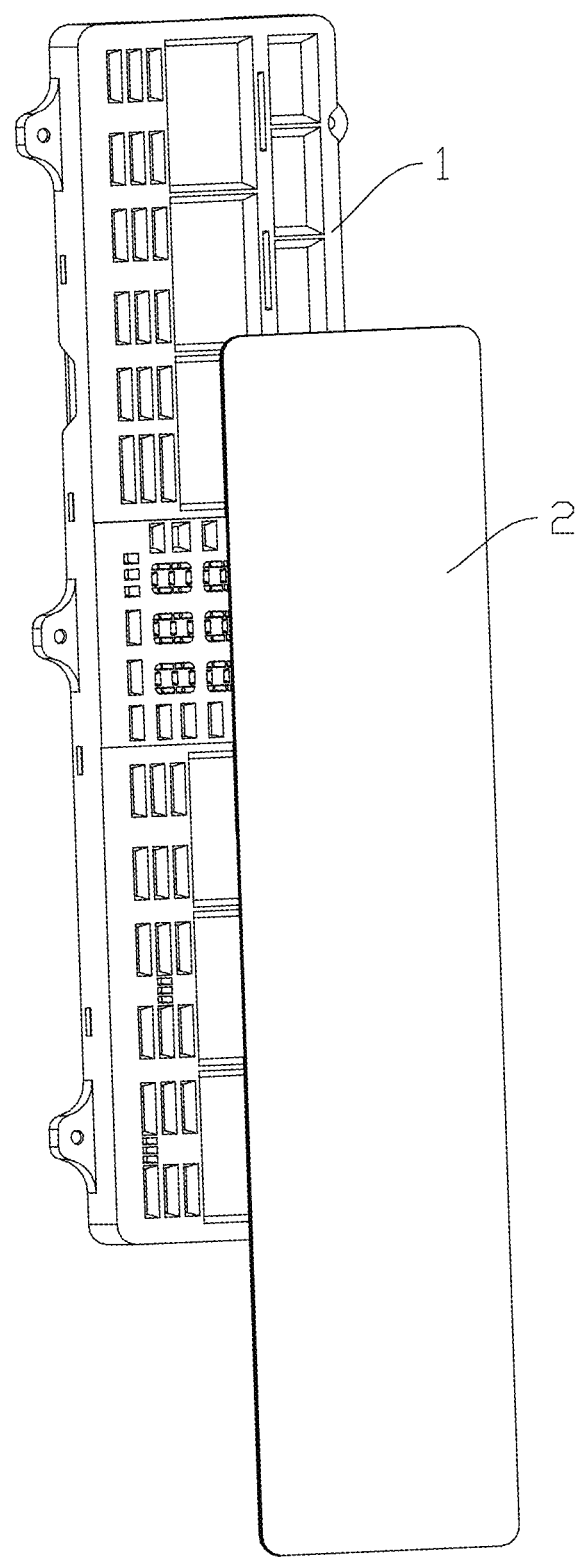
FIG. 1 is an exploded view according to the present disclosure.

Reference numerals in the accompanying drawings:

1. LED light-emitting assembly; 10. housing; 100. light-transmitting groove; 11. PCB; 12. bottom shell; 2. film assembly; 20. dark film; 21. transparent film; 22. white film; 220. capacitive touch circuit; 221. touch area; 222. FPC terminal; 23. insulating film; 24. cushioning foam; and 240. avoidance groove.

DETAILED DESCRIPTIONS OF THE EMBODIMENTS

To make the objectives, features, and advantages mentioned above of the present disclosure more apparent and easily understood, the specific implementation of the present disclosure will be described in detail below with reference to the drawings. Many specific details are set forth in the following description to facilitate thorough understanding of the present disclosure. However, the present disclosure may be implemented in many other ways different from those described herein, similar improvements may be made by those skilled in the art without departing from the connotation of the present disclosure, and therefore, the present disclosure is not limited by the specific implementation disclosed below.

Figure 2:
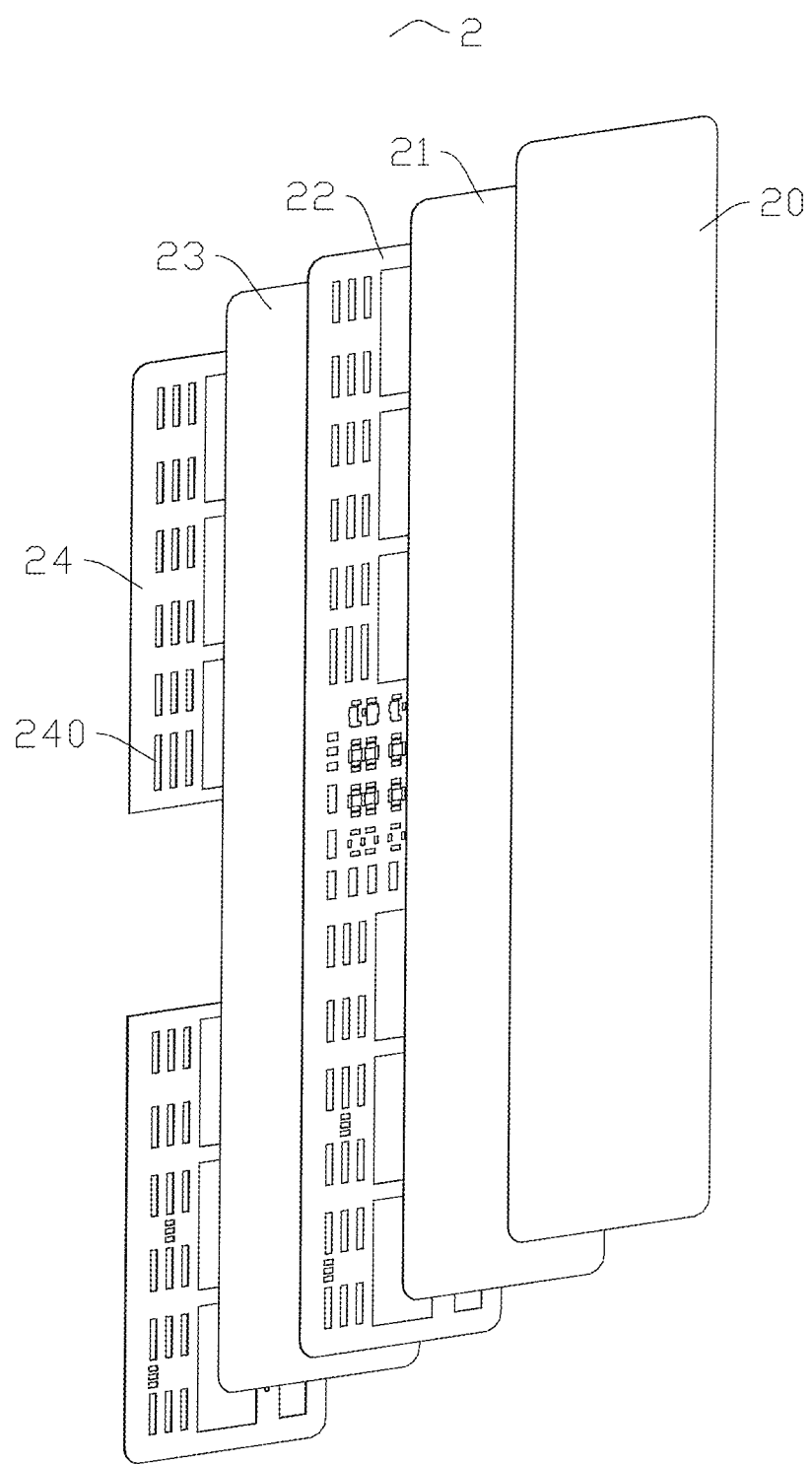
FIG. 2 is an exploded view of a film assembly according to the present disclosure.
Figure 3:
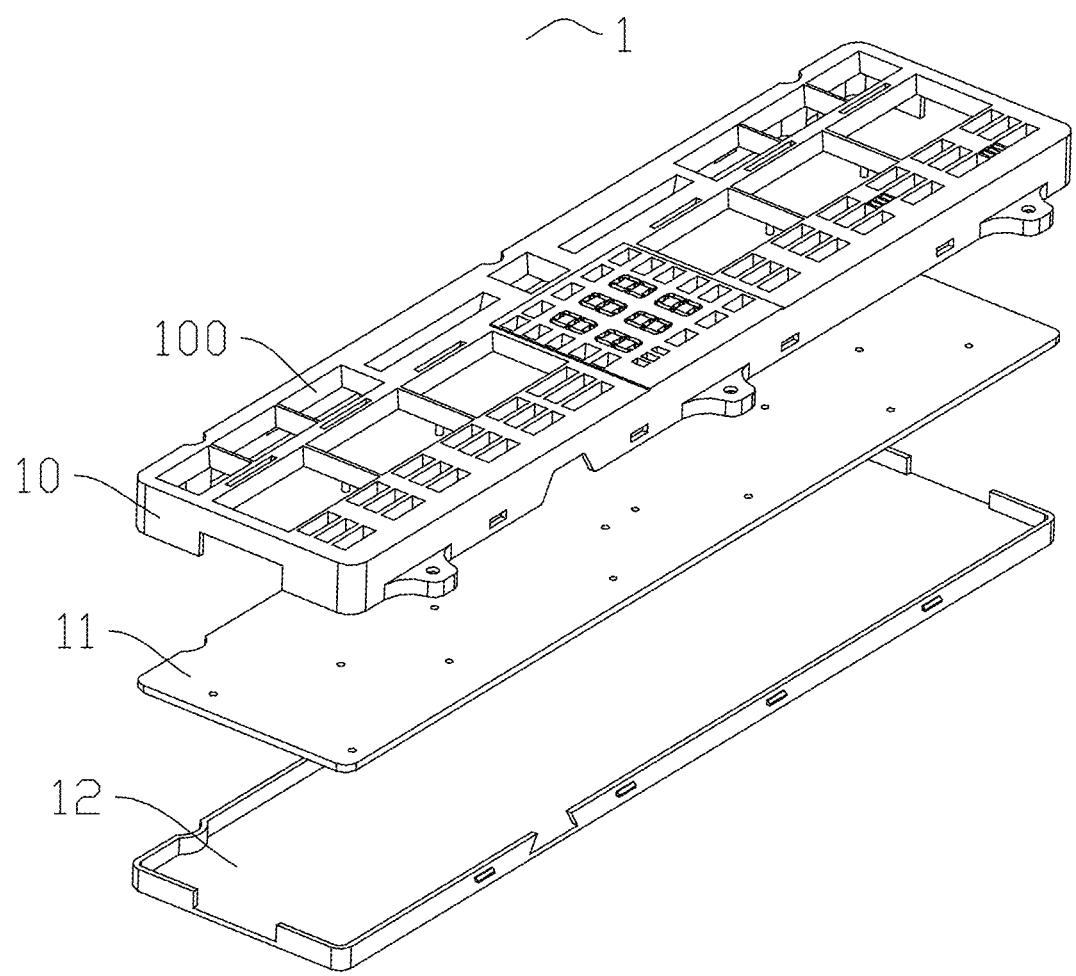
FIG. 3 is an exploded view of an LED light-emitting assembly according to the present disclosure.
Figure 4:
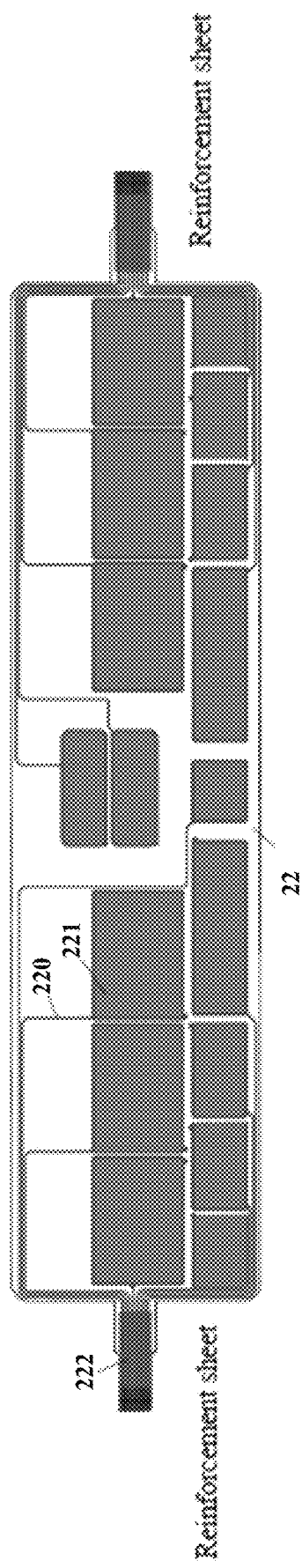
FIG. 4 is an exploded view of a capacitive touch circuit according to the present disclosure.

The present disclosure provides a capacitive touch LED display, as shown in FIGS. 1-3, the display includes an LED light-emitting assembly 1 and a film assembly 2, the film assembly 2 is fixed on a light-emitting surface of the LED light-emitting assembly 1, and the LED light-emitting assembly 1 is configured to illuminate the film assembly 2 and perform control functions;

the film assembly 2 includes a dark film 20, a transparent film 21, a white film 22, and an insulating film 23, where the dark film 20 is attached onto a front side of the transparent film 21, a back side of the transparent film 21 is printed with a first pattern and a first light-blocking layer, the first light-blocking layer avoids the first pattern, the transparent film 21 is attached onto a front side of the white film 22. As shown in FIG. 4, a back side of the white film 22 is printed with a capacitive touch circuit 220, and a touch area 221 of the capacitive touch circuit 220 is printed with conductive ink, the insulating film 23 is attached onto the back side of the white film 22, the insulating film 23 is opposite to the light-emitting surface of the LED light-emitting assembly 1; and the white film 22 is provided with a terminal, the capacitive touch circuit 220 is electrically connected to the terminal, and the terminal is electrically connected to the LED light-emitting assembly 1.

It should be noted that the dark film 20 can be tawny, and the white film 22 can be milky white; the dark film 20, the transparent film 21, the white film 22, and the insulating film 23 can be made from any one of PET soft film, PC soft film, or PMMA; and printing process of the capacitive touch circuit is screen printing with silver paste. In order to improve the integration of the dark film 20, the front and/or back side of the dark film can be formed with frosted texture; a surface of the transparent film 21 is in contrast smooth; and further, the conductive ink is transparent conductive ink, and the insulating film 23 is a transparent insulating film. As shown in FIG. 4, the terminal of the capacitive touch circuit 220 is a flexible printed circuit (FPC) terminal 222, and a reinforcement sheet can be arranged inside the FPC terminal 222.

Specifically, the front side of the white film 22 is printed with a second light-blocking layer, the second light-blocking layer avoids the first pattern, the front side of the white film 22 is printed with a second pattern, the second light-blocking layer avoids the second pattern, and the second pattern avoids the first pattern. A purpose of printing the first pattern and the second pattern on different films is to display different types of patterns in different areas. For example, the first pattern is a colored image (landscape), and the second pattern is a single-color or multi-color graphic (text, numbers, symbols, and the like), to achieve clearer lighting display effects, and to ensure that the user is prevented from clearly observing specific outline and color of the second pattern through the dark film 20. Further, the first and second light-blocking layers are black printed layers.

It should be noted that the printing process of the first pattern can be any one or a combination of screen printing, color printing, or UV inkjet printing, and the printing process is selected according to the actual pattern.

As shown in FIG. 2, the display further includes cushioning foam 24, the cushioning foam 24 is arranged between the insulating film 23 and the light-emitting surface of the LED light-emitting assembly 1, the cushioning foam 24 is provided with an avoidance groove 240 capable of avoiding the pattern, and the cushioning foam 24 is black.

Through structure and color configuration of the film assembly 2, the patterns and outlines on the transparent film 21 and the white film 22 are difficult to be directly observed by the user, such that when the LED light is turned off, the user observes a display screen with a uniform and pure color. Compared with a glass panel that can realize the effects, the present disclosure has a thinner and more impact-resistant structure.

Figure 5:
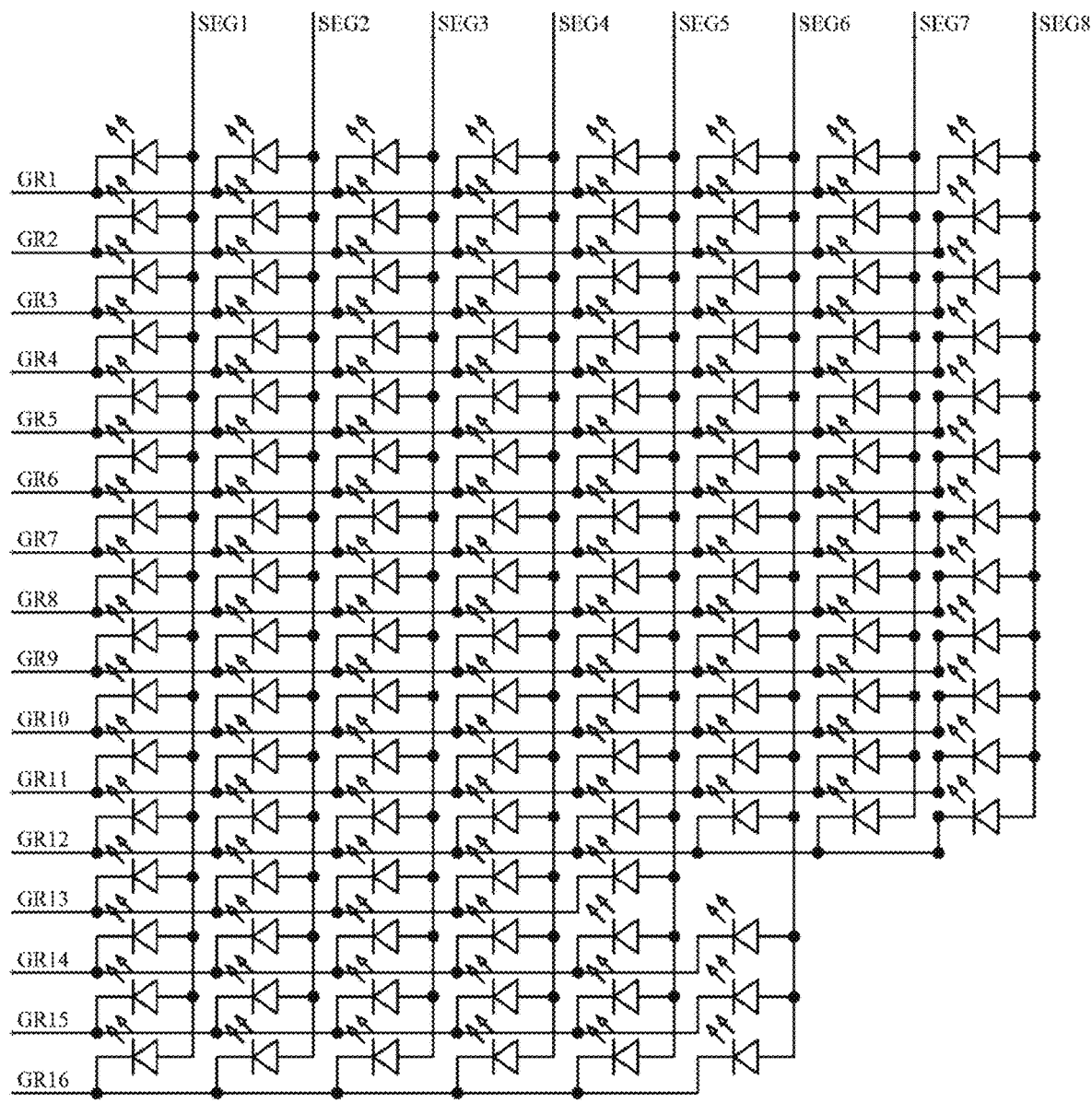
FIG. 5 is a schematic diagram of an LED circuit according to the present disclosure.
Figure 6:
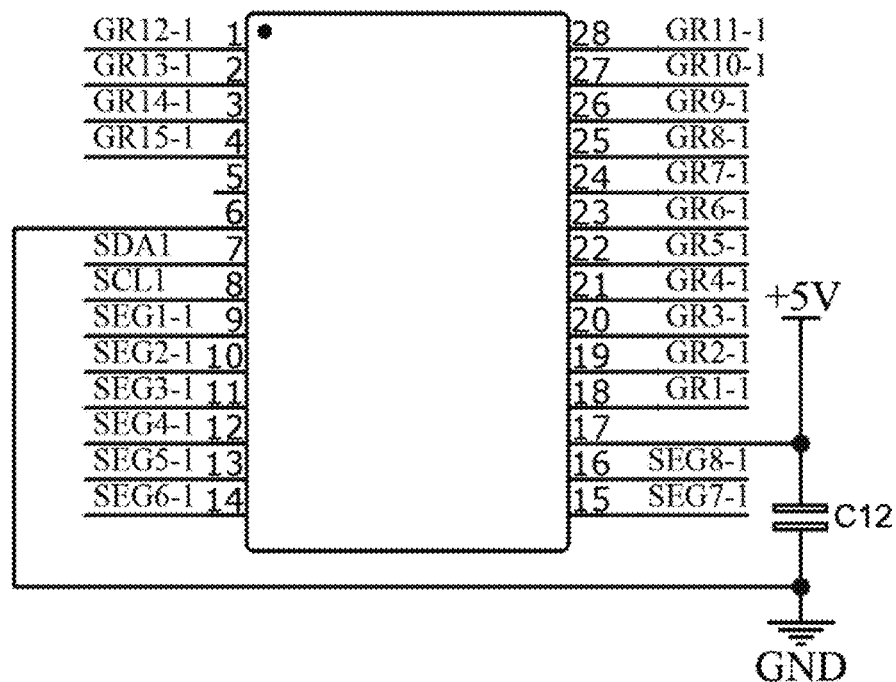
FIG. 6 is a schematic diagram of an LED driving circuit according to the present disclosure.
Figure 7:
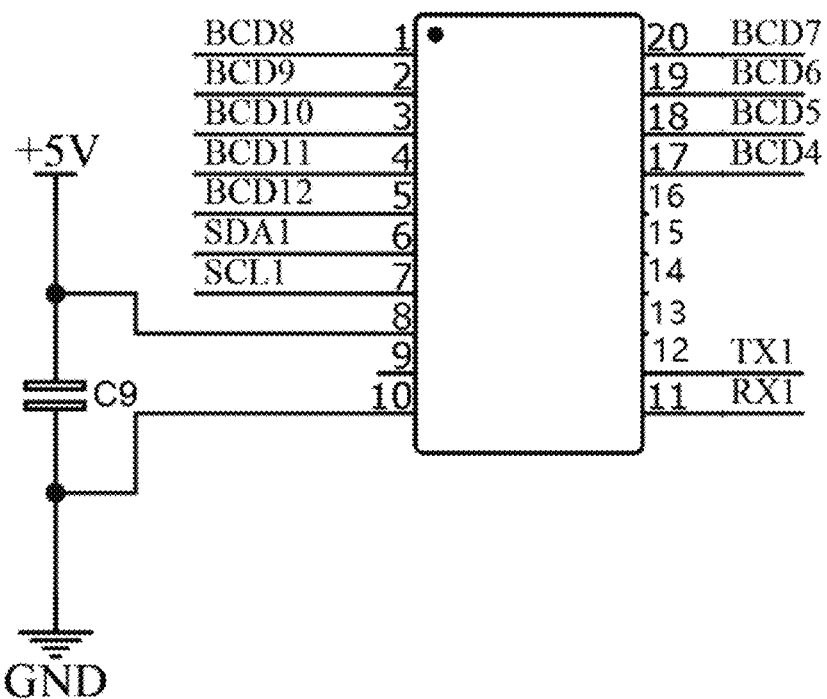
FIG. 7 is a schematic diagram of a main control circuit according to the present disclosure.
Figure 8:
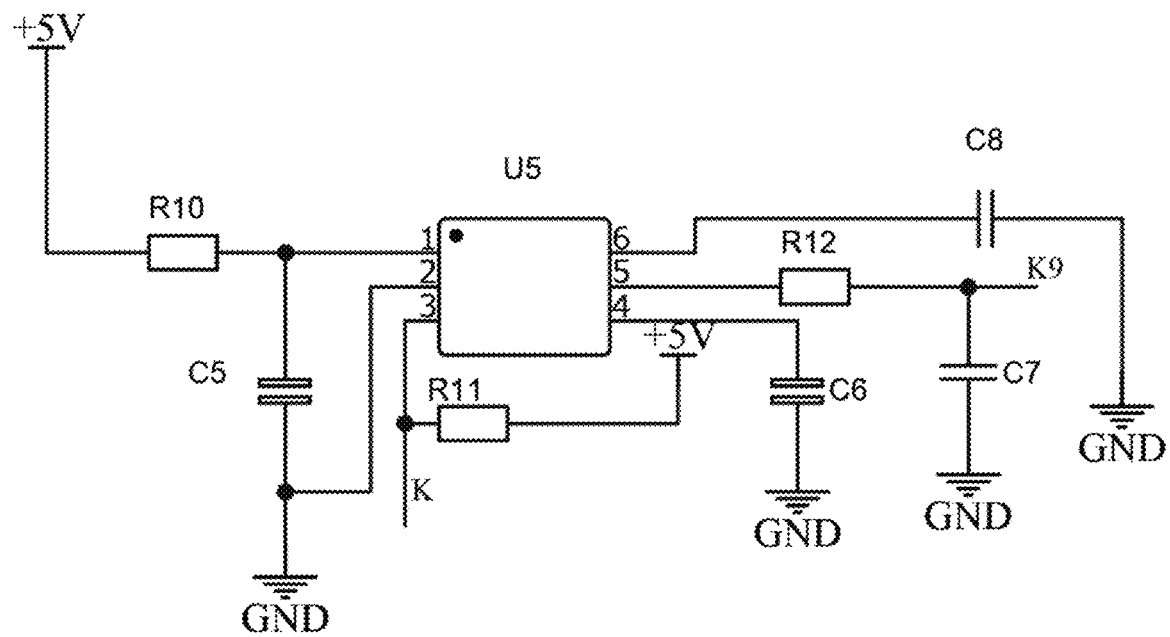
FIG. 8 is a schematic diagram of a capacitive sensing control circuit according to the present disclosure.
Figure 9:
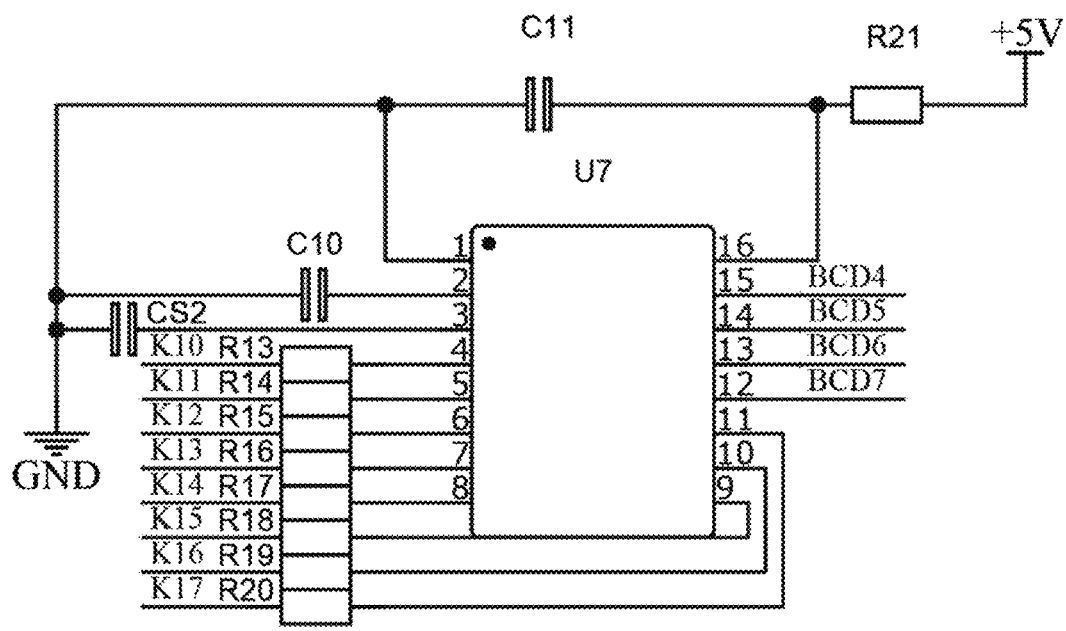
FIG. 9 is a schematic diagram of a capacitive touch control circuit according to the present disclosure.

Specifically, as shown in FIGS. 3 and 5-9, the LED light-emitting assembly 1 includes a housing 10 and a printed circuit board (PCB) 11, where the PCB 11 is mounted inside the housing 10, and the PCB 11 is provided with an LED circuit (conventional LED dot matrix circuit), including 8 SEG lines (SEG1-8) and 16 GR lines (GR1-16) as shown in FIG. 5, an LED driving circuit (driver IC U9) as shown in FIG. 6, a main control circuit (MCU U8) as shown in FIG. 7, a capacitive sensing control circuit (sensing IC U5) as shown in FIG. 8, and a capacitive touch control circuit (control IC U7) as shown in FIG. 9, which can be conventional circuits in the field, therefore, specific composition and connection method of the circuits will not be set forth herein; and The capacitive touch circuit is electrically connected to the capacitive sensing control circuit and the capacitive touch control circuit; and the housing 10 is provided with a light-transmitting groove 100, a spatial position of the light-transmitting groove 100 corresponds to an LED bead of the LED circuit, and the housing 10 is connected to a corresponding bottom shell 12.

Further, the LED light-emitting assembly 1 adopts a front lighting structure or a side lighting structure. When the LED light-emitting assembly 1 adopts the side lighting structure, the housing 10 is provided with a corresponding light guide plate. In order to ensure the display effect, a light-emitting angle of the LED bead is between 120°-160°, and an edge spacing between adjacent LED beads is 0.5-8 mm.

When no cushioning foam 24 is arranged, the insulating film 23 is tightly connected to the light-emitting surface of the LED light-emitting assembly 1, such that the light-transmitting groove 100 is sealed; and when the cushioning foam is arranged, the cushioning foam 24 is tightly connected to the light-emitting surface of the LED light-emitting assembly 1, such that the light-transmitting groove 100 is also sealed, with the aim of ensuring that in the off-state of the LED lights, a light path inside the display is in a dark state when the LED light is in an "OFF" state.

In summary, lighting display of the patterns is implemented through the above film assembly and LED light-emitting assembly. Specifically, the film assembly ensures that the front panel, that is, an outer side of the dark film, is in a pure dark color state when the LED light is turned off, in which case, it is difficult for the user to observe outlines and colors of the patterns, as well as the non-dark film through the display, such that the display surface observed by the user is integrated despite that the display is in the OFF state. Moreover, when the display is in the normal working state, the LED light can illuminate the patterns through the film assembly, thereby displaying the corresponding outlines and colors of the patterns, and the user can also perform touch control according to the corresponding light-emitting pattern.

The embodiments mentioned above are merely one or more of embodiments of the present disclosure, and are specifically described in detail, but may not be interpreted as limiting the patent for the present disclosure. It should be noted that for those of ordinarily skilled in the art, they may make several transformations and improvements on the premise without deviating from concepts of the present disclosure, these transformations and improvements should be considered to fall within the protection scope of the present disclosure. Therefore, the scope of protection of the present disclosure shall be subject to the appended claims.

What is claimed is:

1. A capacitive touch LED display, comprising an LED light-emitting assembly and a film assembly, wherein the film assembly is fixed on a light-emitting surface of the LED light-emitting assembly, and the LED light-emitting assembly is configured to illuminate the film assembly and perform control functions;

the film assembly comprises a dark film, a transparent film, a white film and an insulating film, the dark film is attached onto a front side of the transparent film, the transparent film is attached onto a front side of the white film, a back side of the white film is printed with a capacitive touch circuit, a touch area of the capacitive touch circuit is printed with conductive ink, the insulating film is attached onto the back side of the white film, and the insulating film is opposite to the light-emitting surface of the LED light-emitting assembly; and the white film is provided with a terminal, the capacitive touch circuit is electrically connected to the terminal, and the terminal is electrically connected to the LED light-emitting assembly.

2. The capacitive touch LED display according to claim 1, wherein a front and/or a back side of the dark film can be formed with a frosted texture.

3. The capacitive touch LED display according to claim 1, wherein the conductive ink is transparent conductive ink, and the insulating film is a transparent insulating film.

4. The capacitive touch LED display according to claim 1, further comprising cushioning foam, wherein the cushioning foam is arranged between the insulating film and the light-emitting surface of the LED light-emitting assembly, and the cushioning foam is provided with an avoidance groove.

5. The capacitive touch LED display according to claim 1, wherein the LED light-emitting assembly comprises a housing and a printed circuit board (PCB), the PCB is mounted inside the housing.

6. The capacitive touch LED display according to claim 5, wherein the housing is connected to a corresponding bottom shell.

7. The capacitive touch LED display according to claim 5, wherein the LED light-emitting assembly adopts a front lighting structure or a side lighting structure; and when the LED light-emitting assembly adopts the side lighting structure, the housing is provided with a corresponding light guide plate.

* * * * *